US006782515B2

(12) United States Patent
Scott et al.

(10) Patent No.: US 6,782,515 B2
(45) Date of Patent: Aug. 24, 2004

(54) METHOD FOR IDENTIFYING TEST POINTS TO OPTIMIZE THE TESTING OF INTEGRATED CIRCUITS USING A GENETIC ALGORITHM

(75) Inventors: David G. Scott, Endwell, NY (US); Faisal R. Khoja, Endicott, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 187 days.

(21) Appl. No.: 10/040,122

(22) Filed: Jan. 2, 2002

(65) Prior Publication Data

US 2003/0154432 A1 Aug. 14, 2003

(51) Int. Cl.[7] .............................................. G06F 17/50
(52) U.S. Cl. ............................................ 716/4; 703/13
(58) Field of Search ..................... 716/4, 5, 6; 714/724, 714/728, 733, 734, 738, 739, 741, 726, 727, 729; 706/13, 920; 703/2, 13, 14, 17, 20

(56) References Cited

U.S. PATENT DOCUMENTS

| | | | |
|---|---|---|---|
| 5,455,938 A | * | 10/1995 | Ahmed ........................... 716/5 |
| 5,703,789 A | * | 12/1997 | Beausang et al. ............... 716/4 |
| 5,708,774 A | * | 1/1998 | Boden ........................... 714/38 |
| 5,737,340 A | | 4/1998 | Tamarapalli et al. |
| 5,774,358 A | * | 6/1998 | Shrote ........................... 700/86 |
| 5,805,795 A | * | 9/1998 | Whitten ....................... 714/38 |
| 5,828,828 A | | 10/1998 | Lin et al. |
| 6,038,691 A | | 3/2000 | Nakao et al. |
| 6,070,261 A | | 5/2000 | Tamarapalli et al. |
| 6,256,759 B1 | | 7/2001 | Bhawmik et al. |
| 6,363,519 B1 | * | 3/2002 | Levi et al. ..................... 716/16 |

OTHER PUBLICATIONS

Goldstein, "Controllability/Observability Analysis of Digital Circuits," IEEE Trans. on Circuits and Systems, vol. CAS–26, No. 9, Sep. 1979, pp. 685–693.*

Saab et al., "CRIS: A Test Cultivation Program for Sequential VLSI Circuits," 1992 IEEE/ACM Int'l Conference on Computer–Aided Design, pp. 216–219.*

Rudnick et al., "A Genetic Approach to Test Application Time Reduction for Full Scan and Partial Scan Circuits," 8th Int'l Conference on VLSI Design, Jan. 1995, pp. 288–293.*

(List continued on next page.)

Primary Examiner—Leigh M. Garbowski
(74) Attorney, Agent, or Firm—Orrick, Herrington & Sutcliffe

(57) ABSTRACT

A method for identifying, by way of a genetic algorithm, test points to be inserted in an integrated circuit (IC) chip to improve the testability of the IC is described. The algorithm is particularly well suited for large circuit designs (several million gates) because it allows to simultaneous insert multiple additional test points at critical locations of the IC to gain supplemental controlability and/or observability and thereby eliminating the drawbacks associated with the single test point approach. To further improve performance, cost function gradient techniques are applied to guide the selection of potential test points for consideration by the algorithm. Fault simulation of random patterns is used to more accurately distinguish between random pattern testable and random resistant faults, and to provide a more accurate set of initial probabilities for the cost function calculations. The algorithm further identifies a reduced set of potential candidate test points according to a variety of criteria such as cluster roots, i.e., nodes in the IC having poor controlability at the outputs but good controlability at the inputs, by considering the inputs to the cluster roots as good test point candidates. The genetic algorithm makes it a prime candidate for implementation using parallel processing, wherein multiple computers are used to simultaneously evaluate potential solutions.

15 Claims, 5 Drawing Sheets

OTHER PUBLICATIONS

O'Dare et al., "System design for test using a genetically based hierarchical ATPG system," 1995 IEE Colloquium on Systems Design for Testability, pp. 9/1–9/5.*

Ravikumar et al., "Synthesis of Testable Pipelined Datapaths using Genetic Search," 9th Int'l Conference on VLSI Design, Jan. 1996, pp. 205–210.*

Como et al., "GATTO: A Genetic Algorithm for Automatic Test Pattern Generation for Large Synchronous Sequential Circuits," IEEE Trans. on CAD of ICs and Systems, vol. 15, No. 8, Aug. 1996, pp. 991–1000.*

Rudnick et al., "A Genetic Algorithm Framework for Test Generation," IEEE Trans. on CAD of ICs and Systems, vol. 16, No. 9, Sep. 1997, pp. 1034–1044.*

Chiusano et al., "RT–level TPG exploiting high–level synthesis information," 1999 Proc. VLSI Test Symposium, pp. 341–346.*

Xu et al., "An evaluation of test generation algorithms for combinational circuits," 1999 Proc. East Asian Test Symposium, pp. 63–69.*

Shen, "Genetic algorithm based test generation for sequential circuits," 1999 Proc. East Asian Test Symposium, pp. 179–184.*

Xu et al., "Forecasting the Efficiency of Test Generation Algorithms for Digital Circuits," 2000 Proc. 9th Asian Test Symposium, pp. 179–183.*

Harmanani et al., "A genetic algorithm for testable data path synthesis," 2001 Canadian Conference on Electrical and Computer Engineering, pp. 1073–1078.*

"Test Point Insertion for Scan–Based Bist" Seiss et al. Proceeding of the European Test Conference, pp. 253, 1991.

"Testability–Driven Random Test–Pattern Generation" Lisanke et al., IEEE Transactions on Computer–Aided Design, vol. CAD–6, Nov. 1987, pp. 1082–1087.

"On Testability Analysis of Combinational Networks" Brglez et al, Proceedings of Internations Symposium on Circuits and Systems, pp. 221–225, 1984.

"On Generating Optimal Signal Probabilities for Random Tests: A Genetic Approach", Srinivas et al. VLSI Design, 1996, vol. 4, No. 3, pp. 207–215.

"Statistical Fault Analysis", Jain et al. IEEE Design & Test of Computers, vol. 2, No. 2 pp. 38–44.

* cited by examiner

METHOD FOR IDENTIFYING TEST POINTS TO OPTIMIZE THE TESTING OF INTEGRATED CIRCUITS USING A GENETIC ALGORITHM

FIELD OF THE INVENTION

The present invention is related to a method for optimizing the testing of integrated circuits (IC) and, more particularly, to a method for improving the test coverage by identifying additional test points for be inserted in the IC under test.

BACKGROUND OF THE INVENTION

Digital circuits are tested using a variety of strategies including functional test patterns, deterministic structural test patterns, and random patterns. Random pattern testing is particularly significant because it requires relatively little test data and can be accomplished not only by automated test equipment, but by the digital circuit itself using Built-in Self Test (BIST) circuitry. In order to achieve high random pattern testability, it is often necessary to modify a digital circuit design such that random patterns more easily detect potential defects in the IC under test.

One way of modifying digital circuits to improve random pattern testability is known as test point insertion. During test point insertion, additional logic and scannable latches are added to the logic to provide additional points of control or observation during testing. By way of example, and referring to FIG. 1, there is shown a random-resistant circuit, where the signal feeding the top input of the two input AND gate is nearly always 0 when random patterns are applied to the circuit, since the 16 input AND gate will produce a logic 1 only once every 216 random patterns. Such a path is rarely sensitized to allow faults to propagate through the bottom input of the downstream AND gate. Furthermore, faults in the downstream logic requiring a logic 1 for activation will be rarely be activated. If now, a control-1 test point is added to the circuit, the random pattern testability substantially improves.

Referring to FIG. 2, it is evident that adding an OR-gate driven by a scannable latch improves the probability that a logic 1 will appear on the top input to the 2-input AND gate, and will propagate to downstream logic to enable the detection of certain faults not otherwise tested. Additional faults will be allowed to propagate through the 2-input AND gate, and faults located in the downstream logic requiring a logic 1 for activation will have a much higher probability of being activated. This OR gate driven by a scannable latch is known as a control-1 test point. In other cases, a control-0 test point (implemented as an AND gate) or an observation point (implemented as a signal feeding a scannable latch) may be inserted. The problem being solved by this invention is to efficiently identify where test points should be inserted in the IC, and what type of test points should be added thereat.

Several solutions exist to the problem of test point identification. For instance, in an article by B. H. Seiss, P. M. Trouborst, and M. H. Schulz, "Test Point Insertion for Scan-Based BIST," published in the *Proceedings of the European Test Conference*, pp. 253–262, 1991, a cost function gradient technique for inserting test points is described. This method is based on an earlier work by F. Brglez, published in the article "On Testability of Combinational Networks", *Proceedings of International Symposium on Circuits and Systems*, pp. 221–225, 1984, and on work by R. F. Lisanke, A. J. Brglez, A. J. DeGeus, "Testability-Driven Random Test-Pattern Generation", published in the *IEEE Transactions on CAD*, Vol. CAD-6, November 1987, pp. 1082–1087, all of which are based on random pattern testability. The method described in the aforementioned articles selects one test point at a time from a set of candidate test points, which is chosen according to a set of criteria that estimates the improvement in random pattern testability if the test point were inserted. Each candidate test point is temporarily incorporated in the circuit, and the actual improvement in random pattern testability is measured. Once all of the candidates have been evaluated, the test point providing the largest increase in random pattern testability is added to the circuit. This process is repeated until the maximum number of test points is achieved, or until the circuit reaches a satisfactory level of random pattern testability.

The test point insertion algorithm described in U.S. Pat. No. 6,256,759, "Hybrid Algorithm for Test Point Selection for Scan-Based BIST," to S. K. Bhawmik, et al., improves the performance of the previously mentioned single test point insertion algorithm developed by Seiss et al. By recognizing that the effect of a test point is only significant in the area of logic immediately surrounding the test point, calculations used to determine the effect of a test point on random pattern testability can be reduced by considering only those nodes in the circuit for which the test point has a significant effect.

In U.S. Pat. Nos. 5,737,340 and 6,070,261, "Multi-phase Test Point Insertion for Built-in Self Test of Integrated Circuits", both to N. Tamarapalli, et al., a method for inserting test points into a logic circuit is described, wherein test points are enabled or disabled depending on certain control signals. Each combination of control signals is known as a phase. Additional logic is added to the chip to decode the control signals and to control the operation of the test points. The algorithm for determining test points uses probabilistic fault simulation to determine test point locations rather than way of a COP (Controllability/Observability Program) based approach used in the previously described articles. However, as in previous cases, the test point insertion algorithm determines the added test points one at a time.

The process of test point insertion is further enhanced by considering signal propagation delays through the various paths in the logic circuit, as described in U.S. Pat. No. 5,828,828, "Method For Inserting Test Points for Full and Partial Scan Built-in Self Testing," to Lin and Cheng. The insertion of a test point is disallowed if by doing so it introduces a signal delay that negatively impacts the performance of the circuit. In order to determine whether this situation occurs, the test point is assigned a delay value. For each node in the circuit, a signal slack is computed. (Note: signal slack is the amount of time by which a signal may be delayed before it must reach a specified node in the circuit). If the delay for the test point exceeds the signal slack for the node, the test point is prevented from being added to the node.

In U.S. Pat. No. 6,038,691, "Method Of Analyzing Logic Circuit Test Points, Apparatus for Analyzing Logic Circuit Test Points and Semiconductor Integrated Circuit with Test Points," to Nakao et al., several refinements to the test point insertion process are described. A cell replacement approach reduces the signal delay and area overhead involved when inserting control test points. A control-1 test point is naturally described as a two-input OR gate inserted into a signal, wherein the other input is fed by a scannable latch or primary input. A control-0 test point is naturally described as a two-input AND gate inserted into a signal, wherein the other input is fed by a scannable latch or primary input. Rather than inserting additional gates into a logic circuit, Nakao et al., define a table of acceptable cell replacements such that the insertion of a control-0 or control-1 test point is achieved by replacing a library cell with a given number of inputs (and type) with another cell having a different number of inputs (and type). For example, if a control-1 test point is added to a signal feeding an inverter, the inverter can be replaced with a two input NOR gate. This process reduces both the area and the signal delay imposed by insertion of test points.

An unacceptable signal delay is further reduced by the use of a table that describes paths and/or nodes or hierarchical entities in the circuit where insertion of test points is not allowed because there is insufficient slack in the path to allow additional logic gates to be inserted. Nodes in the circuit are not considered test point candidates if they appear in the table as separate nodes, or nodes along a specified path, or nodes within the specified hierarchical entity.

A further refinement to the test point insertion process taught by Nakao et al. is a method where test points may be inserted if they are not strongly correlated. Nakao et al. define the concept of strong and weak correlation between test points. Two observable points are said to be strongly correlated if their backward cones overlap. Two control points are said to be strongly correlated if their forward cones overlap. Two control points are said to be weakly correlated if they share common nodes whose observability is affected by both control points. Using this definition of correlation, the test point insertion process described is similar to the single test point insertion process pioneered by Seiss et al., except that instead of inserting the single test point providing the largest actual improvement in random pattern testability, the test points are ranked in descending order of actual improvement. The test point with the largest improvement is first inserted and its region of influence is recognized. Then, subsequent test points are inserted (in descending order of actual improvement) and their regions of influence is recognized as long as they are not strongly correlated with any of the previously chosen test points. This process continues until some maximum number of simultaneous test points is reached, or until the algorithm is terminated because of some other limit (such as maximum number of test points, desired random testability, etc.). Finally, the correlation information is also used by Nakao et al, to allow test points to share common scannable latches. Test points which are not correlated are allowed to share a common scannable latch. This reduces the number of scannable latches required.

The method taught by Seiss et al. has been demonstrated to be an effective tool for inserting test points on small circuits. However, given the large number of gates existing in today's chip designs, the method of inserting one single test point at a time has proven to be impractical. Insertion of a single test point requires the evaluation of several candidate test points. The number of candidate test points assessed typically grows linearly with the size of the circuit. Furthermore, the evaluation of a single test point requires updates to the controllability and observability values for a subset of nodes forming the circuit. This process is also a linear function of the number of nodes. Therefore, the insertion of a single test point is a function of the square of the number of gates forming the circuit, expressed as $O(g^2)$, where g represents the number of gates. Assuming that 1 test point for every 1000 gates is to be inserted, its number is a linear function of the number of gates. This makes the entire test point insertion algorithm a cubic function of the number of gates (i.e., $O(g^3)$). This approach runs into performance problems for circuits having several million gates. The work done by Lin and Cheng, while useful to the process of determining accurate test points, does not address the performance aspects of the algorithm. Tamarapalli et al. work is, likewise, also based on the single test point insertion strategy developed by Seiss et al., and displays the same performance problem.

Other related art includes an article by Jain, S. and V. Agrawal, "Statistical Fault Analysis," *IEEE Design Test Comput.*, Vol. 2, pp. 38–44, 1985; and an article by M. Srinivas and L. M. Patnaik, "On Generating Optimal Signal Probabilities for Random Tests: A Genetic Approach," *VLSI Design*, Vol. 4, No. 3, pp. 207–215, 1996.

The present invention is based on the use of a Genetic Algorithm. Basically, the genetic algorithm involves randomly generating several solutions to a problem. These solutions are referred to as individuals in the population. Each individual is evaluated for its fitness. Fit individuals (i.e., good solutions) are combined to form new individuals (hopefully, better solutions) which are added to the population. Weak individuals (i.e., poor solutions), are removed from the population. This series of steps is referred to as a generation and is repeated a number of times or until some "best" solution is achieved. P. Mazumder and E. M. Rudnick in their textbook "Genetic Algorithms for VLSI Design, Layout & Test Automation", published by Prentice Hall PTR, Upper Saddle River, N.J., 1999 provides a good summary on the use of genetic algorithms in other engineering applications.

OBJECTS OF THE INVENTION

It is an object of the invention to improve the testability of an IC by automatically inserting multiple additional test points at critical locations of the IC in order to gain supplemental controlability and/or observability.

It is another object to improve the testability of the IC by finding an optimal set of the test points concurrently rather that individually.

It is a further object to identify a set of test points efficiently and effectively for VLSI chips, modules, and the like, in parallel, using multiple processors.

It is still another object to identify a reduced set of potential candidate test points according to a variety of criteria such as cluster roots (i.e., nodes in the logic having poor controllability at the outputs, but good controllability at the inputs) by considering the inputs to the cluster roots as good test point candidates.

It is still a further object to take a large set of candidate points, divide them into subsets, evaluate various alternatives and solutions of the subsets, compare, combine and produce a new set of solutions, leading to a final set of optimum test points to be ultimately inserted into the circuit under test.

BRIEF SUMMARY OF THE INVENTION

In a first aspect of the present invention, the controllability and observability of the nodes in the circuit is determined. The invention performs fault simulation of random patterns on the circuit to derive the initial controllability/observability information, and to determine which faults are easily tested by random patterns. Next, each node in the circuit is evaluated to measure the testability improvement if a test point were to be inserted at that node. Then, a measure of the circuit overall starting random pattern testability is derived from the controllability and observability information and from the list of faults that were not tested by random pattern simulation.

The actual test point identification process starts by identifying a set of candidate test points. The candidate test points are grouped into subsets (i.e., partial solutions) with each solution consisting of several candidate test points, evenly balanced as to the number of test points per solution. The number of test point candidates per solution and the number of partial solutions are functions of the number of gates in the circuit and the number of test points inserted. Based on their subsequent behavior, it is found that some will improve, some will deteriorate, leading to a final set of optimum test points to be ultimately inserted into the circuit under test. Each partial solution is evaluated to see what improvement it provides to the random pattern testability of the circuit. Once all the solutions have been evaluated, they are ranked according to the improvement they provide. Good solutions are then chosen to be recombined with other solutions to be added to the solution set, while poor solutions are eventually removed. This process is repeated until all of the desired test points have been inserted into the circuit New solutions that are added to the solution set share some common test points with the solutions they were derived from. As solutions are recombined, more and more common test points propagate among the solutions. Over time, the test point solutions converge toward a single, common solution set. The process of recombining and evaluating solutions continues for a number of iterations or until the set of solutions stabilizes according to some measurement. One such example measurement is the percentage of solutions that are identical to the best solution (i.e., the one with the best testability improvement measurement).

Once the solution set converges, all of the test points in the best solution are inserted into the logic circuit by updating the controllability and observability of the nodes where test points are located, and by propagating the new controllability and observability information throughout the circuit. Then the testability measurement of the circuit is recomputed.

Since previous process derives only a subset of the desired test points, new candidate test points are derived and the process is repeated until all of the desired test points are inserted into the circuit.

In a second aspect of the invention, there is provided a method for analyzing an integrated circuit (IC) under test and for identifying and inserting test points in order to improve the testability of the IC, the method including the steps of: a) determining a measure of testability for the IC; b) selecting test point candidates to be evaluated for insertion in the IC and arranging the test point candidates into a first plurality of pairs of sets; c) evaluating the first plurality of pairs of sets and forming a second plurality of pairs of sets from the first plurality of pairs of sets, the evaluation being based on the respective testability improvement achieved by each plurality of the pairs of sets, and recombining the first and second plurality of pairs of sets based on results from the evaluation; and d) repeating step c) until the first and second pairs of sets converge to form the best set, i.e., the set providing the test points to be inserted into the IC.

In a third aspect of the invention, there is provided a method for analyzing an integrated circuit (IC) under test and for identifying and inserting potential test points in order to improve the testability of the IC, the method including the steps of: a) determining a measure of testability for the IC; b) forming a plurality of first sets of test points and determining the size and the number of the plurality of first sets; c) evaluating the improvement in the testability of the IC in the presence of the plurality of first sets of test points; d) performing an inversion and a mutation of the plurality of first sets of test point; e) intermingling pairs of the first plurality of sets to form a second plurality of pairs of sets with the intermingled pairs of the first plurality of sets; f) evaluating the second plurality of pairs of sets to select which first and second pairs of sets should be kept, the selected pairs of sets of the first and second plurality replacing the original first plurality of pairs of sets; and g) comparing the measure of testability for the IC to determine whether the selected plurality of first and second pairs of sets converges towards an optimal set of test points to be inserted in the IC.

BRIEF DESCRIPTION OF THE DRAWINGS

The foregoing and other objects, aspects and advantages of the invention will be better understood from the detailed description of a preferred embodiment when taken in conjunction with the following drawings.

DETAILED DESCRIPTION OF THE INVENTION

In the present invention, the software introduces several sets of test points that are intended to improve the random pattern testability. Each set is inserted into the logic model, and an estimate of the random testability is computed for the circuit, hereinafter referred to as Fault Coverage Estimate (FCE). The FCEs associated with each set are then compared to one another. Good sets of test points (i.e., those having the largest FCEs) are recombined and poor sets are eliminated.

A description of the algorithm used in the invention, which is specifically tailored to identify the test points to be inserted, is provided hereinafter. The essence of the invention resides in creating a genetic algorithm that converges on a test point solution. Moreover, the improvements to the genetic algorithm are designed to make the algorithm rapidly converge on a good solution. The following example is intended to provide some insight to the understanding of the basic genetic algorithm process.

Figure 1:
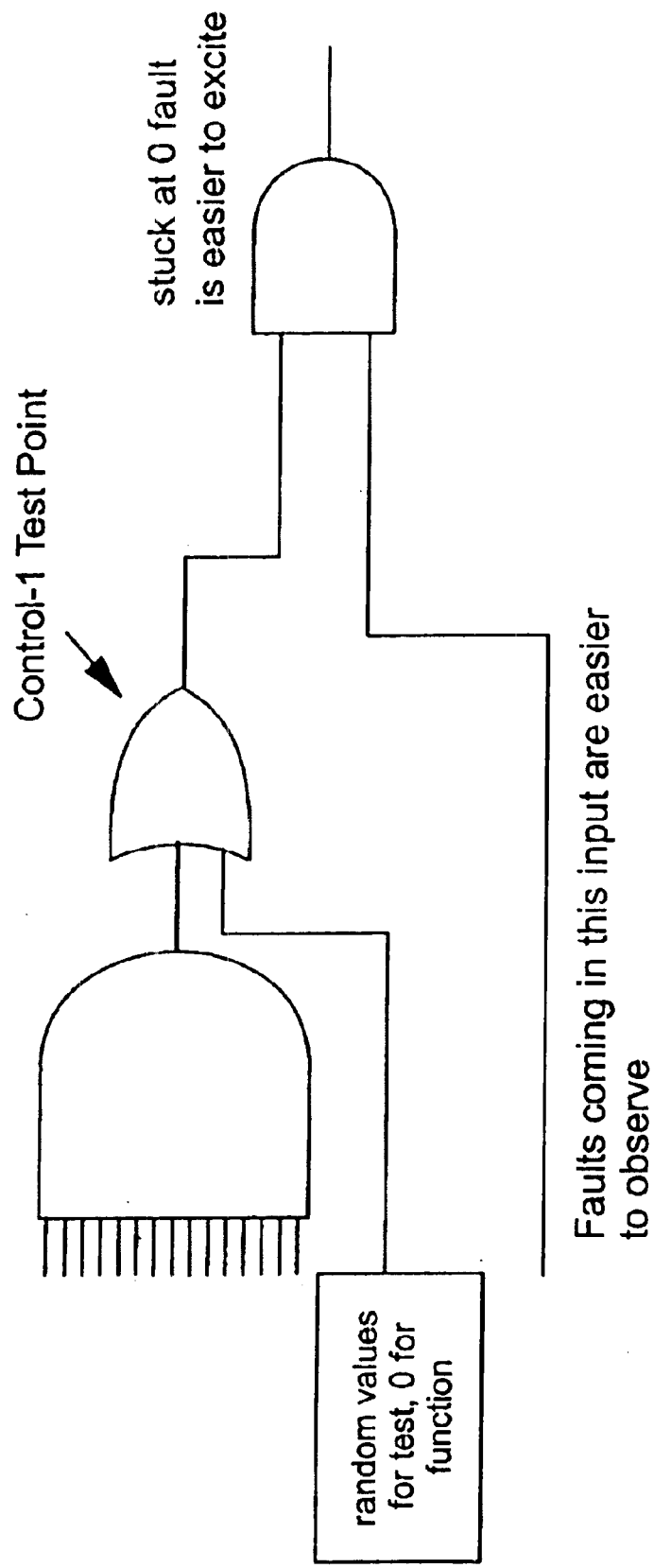
FIGS. 1 and 2 are schematic diagrams of a prior art circuit used to illustrate the concept of test point insertion.
Figure 2:
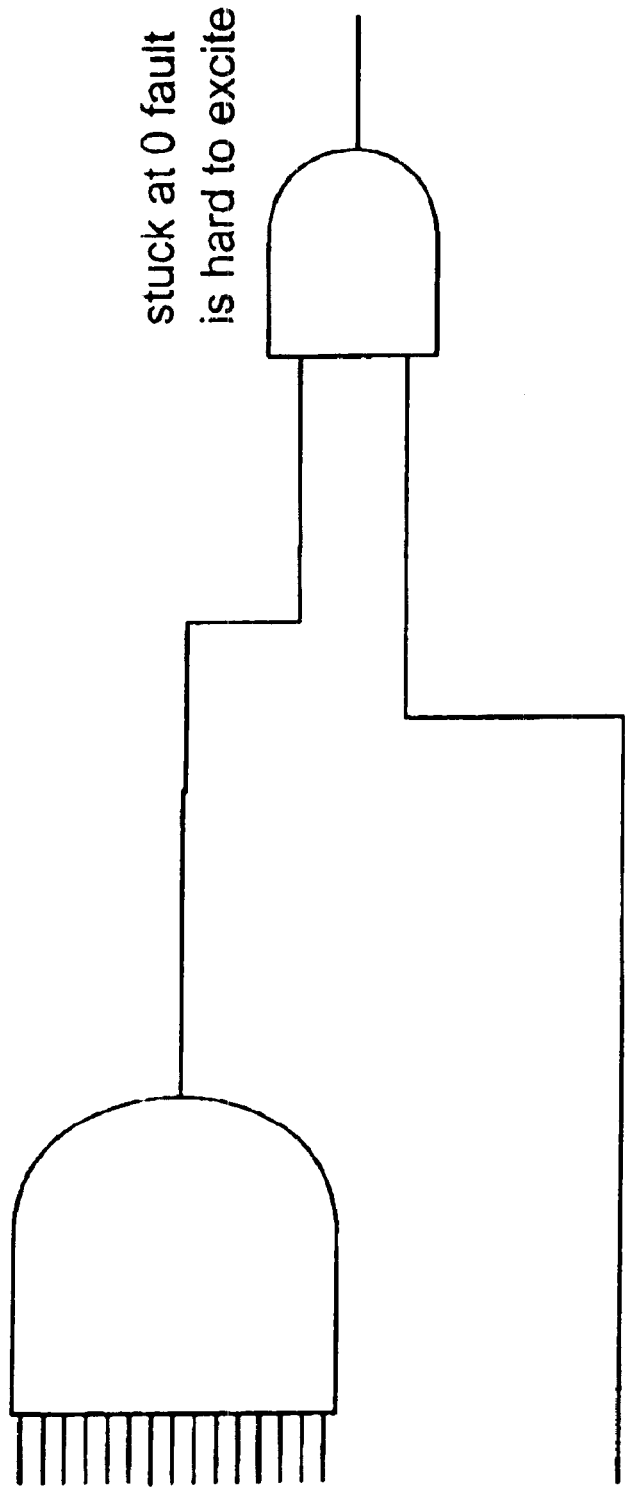
Figure 3:
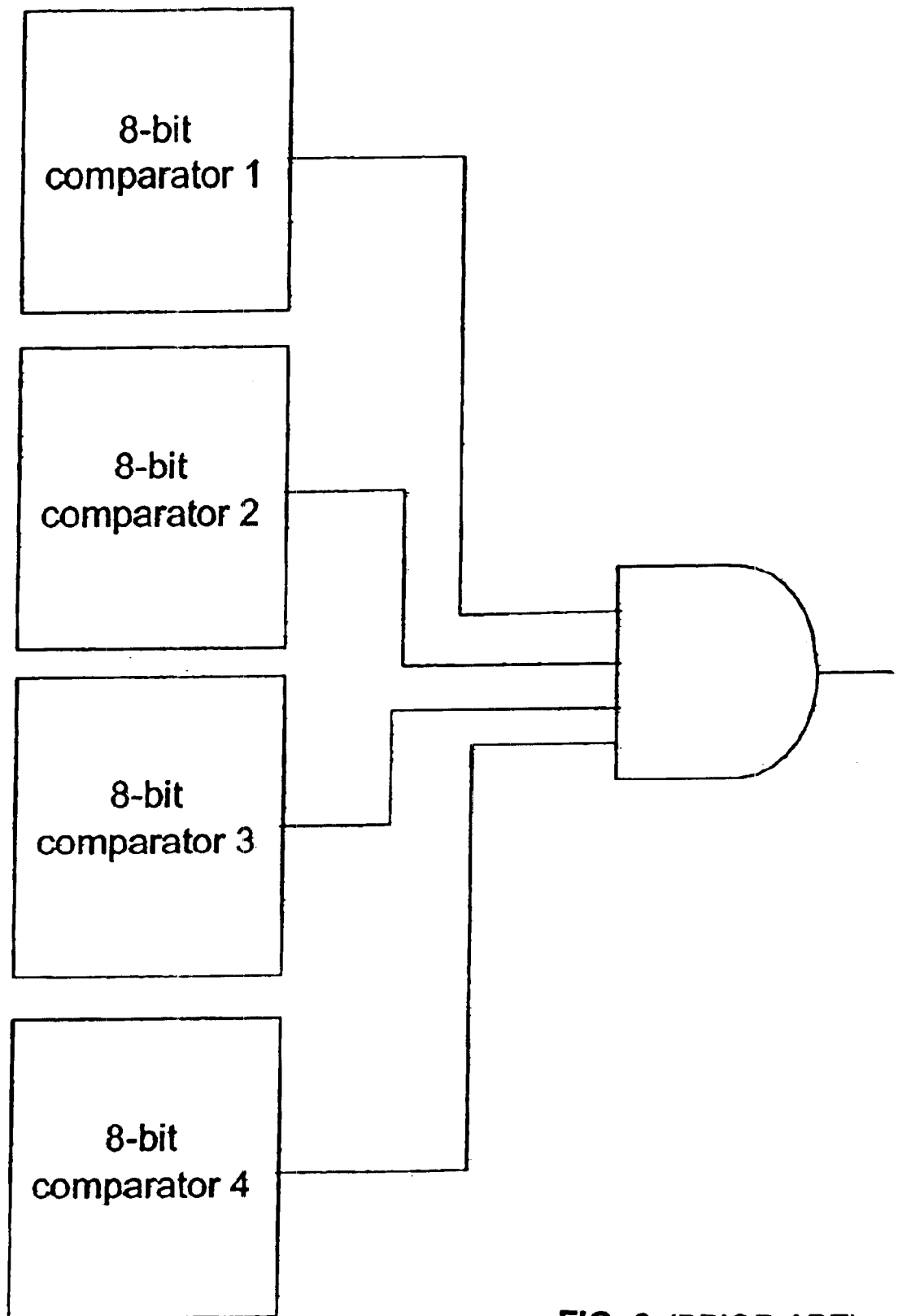
FIG. 3 is a schematic diagram of a prior art random resistant circuit consisting of a 32-bit comparator represented by four 8 bit comparators, to compare two 32-bit buses.

Referring to FIG. 3, there is shown a schematic diagram of a random resistant circuit having a 32-bit comparator to compare two 32-bit buses. If they are equivalent, a logic 1 appears at the output. Otherwise, a logic 0 is generated. The comparator consists of four 8-bit comparators ANDed together.

Figure 4:
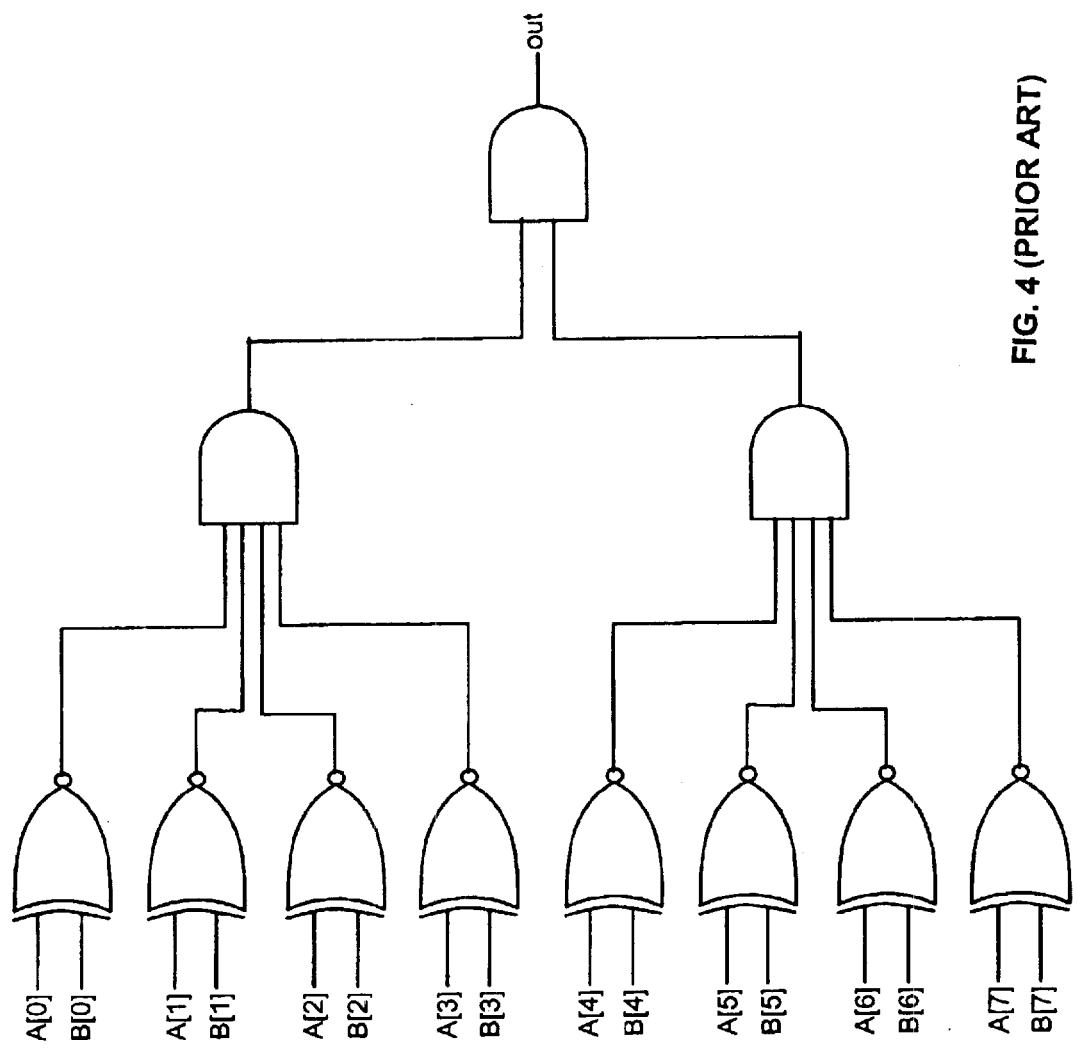
FIG. 4 is a schematic diagram of a detailed implementation of the highly random resistant 32-bit comprarator shown in FIG. 3, wherein by adding observation points at the outputs of the 8-bit comparators, the random pattern testability increases to over 98.5%.

Each 8-bit comparator can be advantageously represented by the circuit illustrated in FIG. 4. The 32-bit comparator shown is random resistant, achieving less than 1% test coverage when simulating 32,000 patterns. Now, by adding 4 observation points at the outputs of the 8-bit comparators, the random pattern testability increases to over 98.5%. When adding 4 control-1 test points instead, the random pattern testability increases to 100%.

Accordingly, two reasonable solutions exist, and the goal is finding one or both of the stated solutions. Test points can also be added at other positions in the circuit; however, for the sake of simplicity the example will be limited to just the stated 8 test point candidates:

TP1: Control-1 at the output of comparator 1
TP2: Control-1 at the output of comparator 2
TP3: Control-1 at the output of comparator 3
TP4: Control-1 at the output of comparator 4
TP5: Observe at the output of comparator 1
TP6: Observe at the output of comparator 2
TP7: Observe at the output of comparator 3
TP8: Observe at the output of comparator 4

Determining an Initial Population

The genetic algorithm starts by determining a list of reasonable candidate test points (e.g., the list shown above). A collection of possible test points is derived from a gradient based Cost Reduction Factor (CRF). Basically, CRF is an estimate of the effectiveness of a single test point. It is based on the partial derivative of the test cost with respect to a change in the controllability or observability at the location of the test point.

A certain number (P) of initial solutions (consisting of multiple candidate test points each) is created either at random or according to some predefined algorithm. Since there are eight test points candidates in the present example, each solution can be represented as an 8-bit vector. The bit is turned on if the corresponding test point is included in the solution. The number of solutions is determined by the genetic algorithm and depends at least partially on the number of possible test points chosen.

Fitness Calculation

By way of example, the bit vector 00100100 represents a solution that includes TP3 (i.e., control-1 at the output of comparator 3) and TP6 (i.e., observe at the output of comparator 2). The set of solutions will be referred hereinafter as the population, and each solution as an individual of the population. It is assumed that the initial population is:

| | Solutions | |
|---|---|---|
| S1) | 00100100 | \ |
| S2) | 00110000 | \ |
| S3) | 10000100 | \ |
| S4) | 00001010 | >A population, |
| S5) | 11000000 | / |
| ... | | / |
| SP) | 00000101 | / | where P represents the number of individuals solutions in the population. Each of the solutions is then evaluated to determine what the estimated fault coverage will be if the aforementioned test points are inserted into the circuit. This is currently known as the Fault Coverage Estimate (FCE).

| | Solutions | FCE |
|---|---|---|
| S1) | 00100100 | 24% |
| S2) | 00110000 | 7% |
| S3) | 10000100 | 24% |
| S4) | 00001010 | 49% |
| S5) | 11000000 | 7% |
| ... | | |
| SP) | 00000101 | 49% |

The Selection

The next step consists in selecting pairs of solutions to intermingle or "crossover" in the hope of getting better solutions. There exists a variety of mechanisms for pairing the solutions such that they can be combined. One approach is to choose solutions at random. With this approach, two solutions are selected at random without replacement. The solution with the higher fitness level (FCE) is selected as a crossover candidate (to be referred as Si). Then, two more solutions are chosen at random, again, without replacement. The better of the two solutions (Sj) is selected to be combined with Si. The process continues, choosing more pairs to crossover until the population is fully depleted. At this point, one-half of the necessary crossovers has been determined. The population is then restored and the whole selection process is repeated. Binary tournament selection guarantees that the best solution will be crossed-over twice, whereas the worst solution will not be crossed-over altogether. Generally, better solutions will tend to be crossed-over more often than weaker solutions.

Crossover

Supposing that the solutions are paired for crossover using the random approach. This results in the following pairs: S2 with S5, S4 with SP, and S1 with S3. Actually, P/2 pairs of crossovers take place but, for illustrative purposes, it is assumed that only the aforementioned three pairs are crossed-over. The process generates two new solutions (i.e., offspring) from a pair of old solutions (i.e., parents). The invention uses a method called 2-point crossover, where a starting point and ending point in the bit string are chosen at random. All the bits between the starting and ending point of one parent are combined with the bits outside the range from the other parent to create one new offspring, and vice versa, for the other offspring.

Assuming that a crossover start point of 3 and a crossover end point of 6 are chosen at random. Then, bits 1, 2, 7 and 8 from one solution will be combined with bits 3, 4, 5 and 6 from the other solution and vice-versa. The result of combining solutions S2 and S5 will then be:

| | Solutions | FCE |
|---|---|---|
| P + 1) | 00000000 | 0% |
| P + 2) | 11110000 | 100%; | the result of combining solutions S4 and SP:

|   | Solutions | FCE |
|---|-----------|-----|
| P + 3) | 00000110 | 49% |
| P + 4) | 00001001 | 49%; | and the result of combining solutions S1 and S3:

|   | Solutions | ECE |
|---|-----------|-----|
| P + 5) | 00000100 | 24% |
| P + 6) | 10100100 | 32% |

Of the new solutions, the best ones are added to the population and the worst ones are eliminated from the population, keeping the size of the population constant.

Inversion and Mutation

The genetic algorithm creates new solutions out of portions of other solutions (when they are crossed-over with each other). In the present invention, the portions are sub-strings of the solution bit vectors. Crossover recombines sub-strings of the parents to obtain new solutions. If two good test points are identified in a particular parent, ideally they should be close together in the solution vector, so that when they are intermingled, they have a higher likelihood of remaining together. If the two test points are not close together, they are likely to be split-up by the crossover process. Occasionally, in a genetic algorithm, the elements of the solution string are reordered, in expectation to bring good the test points together. This process is referred to as inversion, because it is typically implemented by taking a sub-string of each solution and reversing the order of the bits.

Mutation is a genetic algorithm process whereby some bits in some solution are flipped at random (with a relatively low probability of occurrence). This allows solutions that may not otherwise be explored for further consideration.

Evaluating the Population

Once inversion and mutation are performed, the generation process is complete. The population is then examined to see if it is time to stop, or if another generation should be processed. In the present example, the current solution yields 100% random pattern testability, thus, the process is brought to a stop. Ordinarily, more generations would be required. The present invention limits the maximum number of generations to a constant value, although other implementations may use different stopping criteria. Moreover, in the invention, if the FCE of 40% or more of the solutions is equivalent, the population is found to have converged, and the algorithm stops.

Combining the Genetic Algorithm with a Single Test Point Identification

One of the benefits of an algorithm that identifies only a single test point at a time is that it is possible to tell what the incremental (estimated) coverage improvement will be if the test point were inserted. The ability of providing an incremental test coverage improvement allows the user to determine if a subset of the test points is sufficient to achieve the desired random pattern testability coverage. For example, given 10 test points, supposing that the first three make a significant improvement in the random pattern testability, but each of the last seven test points makes hardly any improvement. Then, the user may decide to insert only the first three test points. With a genetic algorithm that identifies a single set of test points, a single coverage improvement is calculated for the complete set of test points. This does not allow the user to see that seven of the test points are relatively ineffective.

By way of the multiple set approach, the present invention eliminates the drawbacks associated with the single test point approach. More particularly, for a set of n desired test points, the genetic algorithm is applied a predetermined number of times (X), each time identifying a fraction (n/X) of additional test points. That is, for each invocation of the genetic algorithm, n/X test points are identified. The random pattern testability coverage improvement is then calculated for these test points and the test points are temporarily inserted into the circuit so that the next invocation of the genetic algorithm will consider their effect on the overall random pattern testability. This process is repeated until all n of the test points have been identified.

If X is defined to be, e.g., 10, then at the conclusion of the run, the user will know what effect adding 10% of the test points will have on the random pattern testability, i.e., the effect of adding 20% of the test points, 30%, 40%, etc. Furthermore, this approach gives the genetic algorithm an opportunity to refresh its list of candidate test points as the candidates change due to the insertion of earlier test points.

Array Implementation vs. Bit-String Implementation

In order to provide the capability of generating a solution containing a fixed number of test points, the standard bit string implementation for a solution was found to be inadequate. Crossover bit strings as in the previous example results in solutions with varying numbers of test points. In the bit string implementation, a particular bit in the string represents the same test point for all solutions. A 1 indicates that test point is present in the solution, and a 0 implies that the test point is not part of the solution. The invention represents individuals of the population as arrays of test points rather than as bit strings. The preferred embodiment further requires that each individual in the population have the same number of elements, although a particular array entry in the various solutions represents different test points. Crossing-over two solutions points is still achieved using a two-point crossover technique, but the starting and ending points refer to entries in the arrays of test points rather than explicit test points, as in the bit string implementation.

Improvements in the Process of Selecting Candidates

The preferred embodiment of the invention uses several methods for achieving a small, but good set of candidate test points to be considered by the genetic algorithm. Reducing the candidate set is important because it allows the genetic algorithm to consider fewer individuals in the population.

Further modifications to the selection techniques result in an even better set of candidates. The present algorithm selects some test points via the Cost Reduction Factor (CRF) as, e.g., any test point with a CRF that resides within, e.g., 0.1 ($CRF_{max}$), where $CRF_{max}$ represents the best CRF to be considered. However, CRF is not always the best measure of good test points. Then, rather than extending the range to 0.01($CRF_{max}$) resulting in an explosion in the number of candidate test points, additional techniques are used to identify potential good test points having a poor CRF.

Other control test point candidates selected by the algorithm include test points inserted before or after a gate, providing good controllability on its inputs but poor controllability on its output. Such a gate is referred to as a cluster root because this is where random resistant faults tend to cluster and be blocked as they propagate through the circuit. The threshold between good controllability and poor controllability is referred to as cluster threshold and depends on the number of patterns being simulated. Gates with a cluster threshold between a predetermined range are chosen as control candidates test points for the genetic algorithm process.

To help determine good observable point candidates, faults are propagated through the circuit according to their fault detection probability. When the fault detection probability for a fault falls below a certain threshold, it is considered to be random resistant and it is dropped from further consideration (propagation). Points in the circuit where the most faults propagate before being dropped are considered observable point candidates to be subsequently used by the algorithm.

Given a set of candidates, the genetic algorithm selects from these a subset for processing, depending on the size of the circuit. Using multiple selection criteria of the candidates instead of a single criterion (such as CRF), allows the algorithm to focus on a reduced number of good candidate test points, since each criterion focuses on a different aspect for the selection of test points.

Candidate Grouping To Improve Convergence

In order to improve the convergence rate to the best solution, the invention groups, whenever possible, test points having similar attributes in the same initial solution. For example, test point candidates with the same CRF are grouped into the initial solution. Since logic circuits often have highly regular sections of logic or are similar in nature (four 8-bit comparators in the example above), their CRFs often exhibit a similar regularity. Thus, a good test point for one section of logic with a particular CRF is likely to have a related test point in another section of logic with the same CRF. Test point candidates that are selected because of their good CRF are grouped accordingly. Test point candidates that are selected because they are near a cluster root are grouped together as well. Candidate grouping has shown to provide significant improvements in the convergence properties of the genetic algorithm.

Using Fault Simulation to Improve Controllability and Observability

Many of the existing test point insertion algorithms use the algorithm described by F. Brglez and known as COP (Controllability/Observability Program) to determine initial signal probabilities and observabilities, and fault detection probabilities. Basically, COP computes the controllability and observability of a circuit based on a topological trace.

It is known in the art that the COP algorithm does not adequately model reconvergent fan-out, causing significant error in the calculations of these numbers. The negative effect of reconvergent fan-out on controllability and observability in real circuit designs is reduced in the invention by the use of fault simulation prior to the start of the test point identification algorithm. The invention uses fault simulation to determine which faults are random pattern resistant, eliminating faults that are in fact tested by some set of random patterns. Since fault simulation also includes a good machine simulation, the tool is able to calculate the actual signal controlability, which in turn provides better signal observability.

Parallel Processing Enhancement

As stated previously, the genetic algorithm used in the preferred embodiment of the invention lends itself to implementation by parallel processing. Each individual in the genetic algorithm population represents a collection of potential test points. While processing the algorithm, the test points for each individual of the population are inserted into the circuit and the fitness level Fault Coverage Estimate (FCE) is obtained. Since this process is repeated for each individual and the process is independent of each individual, the work can be segmented into several sub-processes, each occurring in parallel on one of many processors. That is, given n processors and m individuals in the population, each of the n processors can insert test points and evaluate the fitness level for a fraction (i.e., m/n) individuals. The more processors are available, the faster the evaluation process takes place.

A main control process is responsible for guiding the overall test point identification genetic algorithm, selecting test point candidates, and determining which candidates belong to which individuals in the population. Information about each of the individuals in the population is then passed to a sub-process in a round-robin fashion until all of the individuals in the population are processed. The sub-processes are responsible for inserting a set of test points into the circuit, evaluating the fitness level (FCE) and reporting back to the main process. The main process then takes the FCEs of all the individuals and makes decisions on the overall population (i.e., which ones to drop, which ones to crossover, etc.) Once the main process converges on a set of test points that should be inserted permanently into the circuit, a message is broadcast to each sub-process to insert the test points simultaneously. Then, the process continues.

Shown in Table I are results obtained with the invention using real circuits. CPU time for a single test point insertion (TPI) represents the time required to execute prior art test point identification algorithms currently available and which identify test points one at a time. In comparison, the CPU time for the novel genetic TPI of the invention represents the CPU time required to execute the new genetic algorithm that identifies many test points simultaneously. The test coverage corresponding to these two methods show the test coverage obtained after inserting the test points identified by the respective algorithms. The inventive genetic algorithm provides good results in a fraction of the time.

TABLE I

| k Circuit | Size (gates) | #Test Points | Test Coverage befor TPI | CPU time for Single TPI | Test Coverage after Single TPI | CPU time for Genetic TPI | Test Coverage after Genetic TPI |
| --- | --- | --- | --- | --- | --- | --- | --- |
| A | 116K | 116 | 94.80% | 33 mm. 30 sec. | 97.07% | 9 min. 36 sec. | 96.62% |
| B | 235K | 235 | 86.53% | 3 hr 49 mm. | 91.82% | 42 min. | 92.64% |
| C | 339K | 339 | 84.91% | 6 hr 18 mm. | 92.60% | 1 hr. 3 min. | 91.57% |
| D | 2.2 M | 1000 | 87.67% | N/A | N/A | 5 hr. 24 min. | 92.09% |

Figure 5:
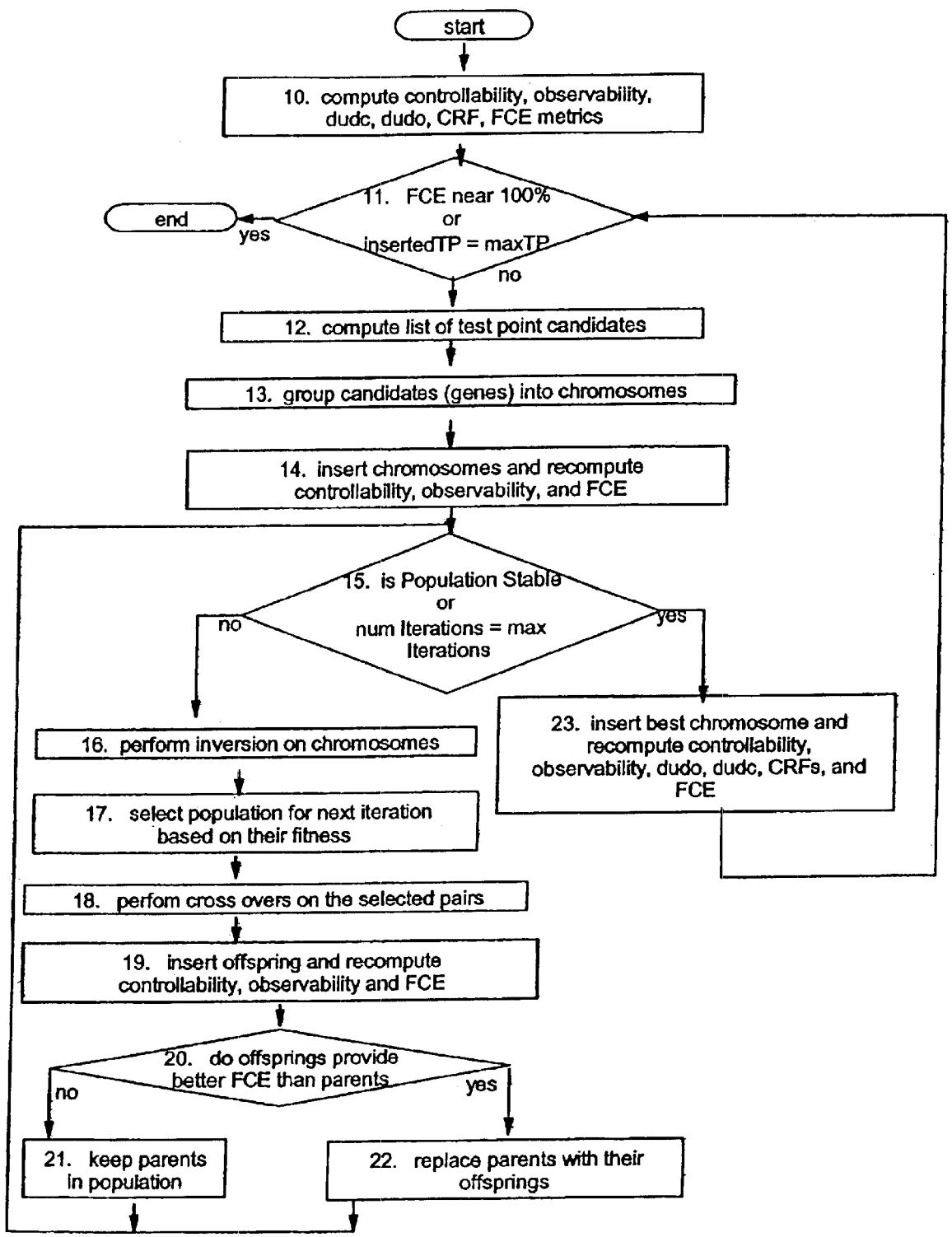
FIG. 5 is a flow chart of the genetic algorithm, according to the present invention, which describes the method used for identifying test points to be inserted in order to improve the testability of the IC under test.

Referring now to FIG. 5, there is shown a flow chart describing the genetic algorithm used for test point insertion.

Block 10. The controllability, observability and other metrics associated with the cost-function gradient techniques are computed. The starting fault coverage estimate (FCE) is also determined.

Block 11. If the current FCE of the circuit is near 100% or the maximum number of test points has been inserted into the circuit (for a user selected parameter), the algorithm stops. The algorithm determines multiple test points at once, but the number of test points is only a subset of the total count.

Block 12. New test point candidates are selected. For each node in the circuit, if a fault propagates to that node, its fault detection probability at that point in the circuit is computed. Only if the probability of detection is above a certain threshold, the fault is allowed to continue propagating. Nodes where the largest number of faults propagate are selected as candidates points for observability.

An additional technique used to determine control point candidates is based on cluster roots. If the controllability of the output of a node is less than a specified threshold (i.e., the controllability is skewed toward 0 or 1), but the input to node inputs have a controllability greater than the specified threshold, then the node is referred as a cluster root. A cluster root often identifies a point in the circuit causing random pattern testability problems. Improving the controllability of the cluster root often allows faults to propagate more easily through the cluster root, allowing faults downstream from the cluster root to become activated. The algorithm chooses the inputs to cluster roots as potential control point candidates. In order to keep the test point insertion problem manageable, the algorithm limits the total number of candidates to a maximum based on circuit size.

Block 13. As stated previously, the following steps identify a subset of the total number of test points to be inserted into the circuit. The number of test points in the subset (M) is chosen based on the circuit size and on the number of test points already chosen. Larger circuits have a larger M. In the early stages of the test point algorithm, when relatively few test points have already been chosen, M is also limited. Limiting M at the beginning of the process allows it to improve the filtering process of less effective test points candidates. Given T candidate test points, the candidates are divided into T/M groups, of M test points each (rounded where necessary). Each candidate is referred to as a "gene" in the genetic algorithm terminology. A group of candidates including a potential solution, is referred to as a "chromosome" or individual. The collection of chromosomes (individuals) is referred to as the population. Test point candidates are grouped by chromosomes according to a particular metric. Observable test point candidates are grouped when possible into a common chromosome, test point candidates chosen as cluster roots into a common chromosome, etc. This heuristic implementation was selected because test points with a common characteristic are often related.

Block 14. Each of the chromosomes (i.e., subsets of test point solutions) are inserted into the circuit by adjusting the controllability and observability metrics. However, when multiple test points are added, it also affects multiple cones of logic. Updating the observability and controllability is performed in the following way: for controllability, the node (or input to the node) is flagged indicating that the controllability needs to be updated. Then, a trace is forwarded from that node, identifying nodes in the forward cone. If a node is encountered that has already been marked, the forward tracing along that path stops. For each node encountered during the forward trace, the inputs to that node are identified with a separate flag indicating that the observability needs updating. Once the nodes have been identified, the controllability is updated by forward tracing from the test point nodes updating the marked nodes. For observability, a flag is set on the observable point node that indicates that the observability required updating. Then, a backtrace from that node is performed, identifying the nodes in the backward cone. If a node is encountered that has already been marked, the backtracing along that path stops. Once this process has been completed, the observability is updated by backtracing from the test point nodes, updating the identified nodes. Once the metrics have been calculated, (e.g., the FCE of the circuit,) the subset of test point solutions inserted is recomputed. The process is repeated for all of the chromosomes, and the FCE for each chromosome is recorded.

Block 15. A check is made to determine if the population is relatively stable. If a certain percentage of the chromosomes have approximately the same FCE, the population is considered stable. Otherwise, the process continues iterating for a predetermined number of times or until the population becomes stable.

Block 16. Each chromosome in the population is assigned a probability of inversion. Inversion is the process of reordering the genes (test points) within the chromosome with the hope of bringing good genes (test points) close together in the chromosome. If a chromosome is selected for inversion (by some pseudo-random number generation process), a contiguous subset of genes in the chromosome are chosen at random, and the relative positions of the genes within the subset are reversed, i.e., the first gene in the subset becomes the last gene, the second gene becomes the second to last, etc. This process changes only the position of the genes but does not affect the FCE calculation.

Block 17. The chromosomes in the population are then selected or paired for crossover. Crossover is a process by which pairs of chromosomes are intermingled (combined) to form new chromosomes (test point solutions.) The binary tournament selection process is used in the invention, although other selection processes may be used. In a binary tournament selection, two chromosomes are chosen at random (without replacement). The chromosome with the higher FCE (C1) is selected for crossover. Then, two more chromosomes are chosen at random. The chromosome with the higher FCE is selected for crossover with C1. This process is repeated until all of the chromosomes in the original population (N) have been chosen, whether or not they were selected for crossover. Then, the set of original chromosomes is restored and the process is repeated again. When complete, there will be N/2 pairs of chromosomes selected for crossover.

Block 18. Each of the pairs of chromosomes are crossed-over. A two-point crossover algorithm is advantageously used. During a two-point crossover, two positions in the chromosome are picked at random, namely a crossover starting position and a crossover ending position. Contiguous subsets of genes (test points) between the crossover starting and ending positions of a pair of chromosomes are swapped, creating two new chromosomes, referred to as offspring. The pair of chromosomes being crossed-over are referred to as parents.

Block 19. The test points in each offspring are then inserted into the circuit, one offspring at a time, and the associated controllability, observability and FCE are recomputed, according to the previous description.

Blocks 20, 21, 22. A check is then made of the offspring FCEs relative to their parents. If the FCE of either offspring is better than the better FCE of the parents, then the offspring are added to the population and the parents are removed. Otherwise, the parents remain in the population and the offspring are discarded. Once the process is completed for all of the pairs of chromosomes chosen for crossover, the population is checked for stability (step 15).

Block 23. Once the population becomes stable, the subset of test points associated with the best chromosome in the population are inserted into the circuit, and the controllability, observability, du/do, du/dc, $CRF_{obs}$ and $CRF_{ctl}$ of the nodes are recalculated. Then the FCE of the circuit is updated. The algorithm then proceeds to step 11, to insert more test points or stop.

Whereas the present invention has been described in terms of a preferred embodiment, it will become apparent to those skilled in the art that changes and modifications may be made thereto without departing from the spirit and the scope of the invention, all of which fall within the scope of the appended claims.

What is claimed is:

1. A method for analyzing an integrated circuit (IC) under test and for identifying and inserting test points in order to improve the testability of the IC, the method comprising:
   a) determining a measure of testability for the IC;
   b) selecting test point candidates to be evaluated for insertion in said IC and arranging said test point candidates into a first plurality of pairs of sets;
   c) evaluating said first plurality of pairs of sets and forming a second plurality of pairs of sets from said first plurality of pairs of sets, said evaluation being based on the respective testability improvement achieved by each plurality of said pairs of sets, and recombining said first and second plurality of pairs of sets based on results from said evaluation;
   d) repeating step c) until said first and second pairs of sets converge to form a best set, said best set providing the test points to be inserted into the IC; and
   e) repeating steps a) through d) until all the test points to be inserted have been incorporated into the IC,
   wherein in step a) the measure of testability for the IC is determined by a combination of fault simulation and fault detection probability.

2. The method as recited in claim 1, further comprising:
   f) performing a fault simulation using a set of random patterns to identify faults detected by the random patterns;
   g) computing a measure of controllability based on the number of times the IC takes a predetermined logic value during the fault simulation;
   h) deriving a measure of observability from the measure of controllability;
   i) assigning a detection probability of 1.0 to a fault that was detected by the random patterns;
   j) assigning a detection probability for the remaining faults according to the measure of controllability and observability respectively derived from steps g) and h); and
   k) accumulating the detection probability for all the faults in the IC.

3. The method as recited in claim 2, wherein in step g) further comprises applying a first selection criteria, wherein said applying a first selection criteria comprises:
   l) estimating the testability improvement of the IC derived from inserting the test point based on changes in the measure of controllability and observability;
   m) measuring the number of faults having a probability of detection nearing 1.0 if an observable point is placed at a particular location in the IC; and
   n) determining cluster roots representing nodes having poor output controllability and good input controllability and using inputs of the cluster roots as candidate test points to be inserted in the IC.

4. The method as recited in claim 3 wherein in step n) the number of candidate test points is computed as a linear function of the number of gates in the IC until a maximum number of candidate test points is reached.

5. A method for analyzing an integrated circuit (IC) comprising sequential and combinational logic gates for identifying and inserting potential test points in order to improve the testability of the IC, the method comprising:
   a) determining a first measure of testability for the IC;
   b) forming a plurality of first sets of test points and determining the size and the number of said plurality of first sets;
   c) evaluating the improvement in the testability of the IC in the presence of said plurality of first sets of test points;
   d) performing an inversion and a mutation of said plurality of first sets of test points;
   e) intermingling pairs of said first plurality of sets to form a second plurality of pairs of sets with said intermingled pairs of said first plurality of sets;
   f) evaluating said first plurality of pairs of sets and said second plurality of pairs of sets to select which first and second pairs of sets should be kept, said selected pairs of sets of said first and second plurality replacing the original first plurality of pairs of sets;
   g) determining a second measure of testability for the IC; and
   h) comparing the first measure of testability for the IC to the second measure of testability to determine whether the selected plurality of first and second pairs of sets converges towards an optimal set to be inserted in the IC as additional test points.

6. The method as recited in claim 5, wherein in step b) the size of the sets of test points is determined as a linear function of the number of gates forming the IC and the number of the sets of test points thus far inserted, wherein the size of the sets of test points is limited by an arbitrary upper limit, said limit being increased as more sets of test points are inserted into the IC, and wherein the number of the sets is determined by dividing the number of test points by the size of the set.

7. The method of recited in claim 5, wherein in step c) said sets of test points are grouped into a plurality of first sets according to a predetermined selection criteria.

8. The method as recited in claim 5 wherein in step d), performing an inversion and a mutation of said plurality of first sets of test points further comprises:
   i randomly selecting a starting point and an ending point for the inversion;
   j) reversing all the points located between said the starting point and the ending point thereby interchanging said starting point with said ending point and all the points therebetween; and
   k) selecting a mutation point and a random number to determine if mutation is to occur, wherein if said mutation occurs, the test point at the mutation point is arbitrarily replaced with another test point chosen at random from among the set of test points.

9. The method as recited in claim 5 wherein step e) further comprises pairing said sets of test points, wherein said pairing comprising:
   l) selecting at random a first set of test points from said first plurality of sets;
   m) selecting at random a second set of test points from said first plurality of sets;

n) selecting for the first member of the pair the set of test points from steps k) or l), according to which set has a higher testability;

o) repeating steps l) through n) to select the second member of said pair;

p) forming iteratively subsequent pairs as in steps l) through o); and q) repeating steps l) through p) until the pairs forming said first plurality have been selected.

10. The method as recited in claim 9, further comprising the step of refreshing said first plurality of sets of test points to its original state and repeating steps l) through q) to generate a total number of pairs of test point sets to be intermingled.

11. The method as recited in claim 5, wherein in step e) said intermingling comprises:

r) selecting at random a crossover starting point and ending point for each pair of sets (X and Y) to be intermingled; s) creating a first new set consisting of all the test points in (X) that reside within the starting and the ending points and of all test points in (Y) that are outside the starting and ending points; and t) creating a second new set consisting of all the test points in (X) that reside outside the crossover starting and ending points and consisting of all test points in (Y) that are inside the crossover starting and ending points, said first and second new sets forming a pair of new sets.

12. The method as recited in claim 11 further comprises determining if the pair of new sets should be kept as part of a population by determining if the testability of either set of the new pair of sets is better than the best testability achieved by either set of the original pair of sets; and else, removing the new pair of sets from the set of the original pair of sets from the population.

13. The method as recited in claim 5, wherein in step h), determining whether the a population of pairs of sets of test points has converged, and determining whether the convergence criteria have been met.

14. The method as recited in claim 5, wherein a plurality of sets of test points are processed in parallel on a plurality of computer processors to reduce the time required to perform the test point insertion process.

15. A program storage device readable by a machine, tangibly embodying a program of instructions executable by the machine to perform method steps for analyzing an integrated circuit (IC) under test and for identifying and inserting test points in order to improve the testability of the IC, comprising:

a) determining a measure of testability for the IC;

b) selecting test point candidates to be evaluated for insertion in said IC and arranging said test point candidates into a first plurality of pairs of sets;

c) evaluating said first plurality of pairs of sets and forming a second plurality of pairs of sets from said first plurality of pairs of sets, said evaluation being based on the respective testability improvement achieved by each plurality of said pairs of sets, and recombining said first and second plurality of pairs of sets based on results from said evaluation;

d) repeating step c) until said first and second pairs of sets converge to form a best set, said best set providing the test points to be inserted into the IC; and e) repeating steps a) through d) until all the test points to be inserted have been incorporated into the IC, wherein in step a) the measure of testability for the IC is determined by a combination of fault simulation and fault detection probability.

* * * * *